US007358784B2

(12) United States Patent
Kim et al.

(10) Patent No.: US 7,358,784 B2
(45) Date of Patent: Apr. 15, 2008

(54) DELAY LOCKED LOOP

(75) Inventors: Kyoung-Nam Kim, Kyoungki-do (KR); Hwang Hur, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 1 day.

(21) Appl. No.: 11/528,281

(22) Filed: Sep. 28, 2006

(65) Prior Publication Data

US 2007/0069781 A1    Mar. 29, 2007

(30) Foreign Application Priority Data

Sep. 29, 2005   (KR) .................... 10-2005-0091681
May 31, 2006   (KR) .................... 10-2006-0049120

(51) Int. Cl.
*H03L 7/06* (2006.01)

(52) U.S. Cl. .................. 327/158; 327/149; 327/142

(58) Field of Classification Search ............... None
See application file for complete search history.

(56) References Cited

U.S. PATENT DOCUMENTS

| 6,262,608 | B1 * | 7/2001 | O'Hearcain et al. | ........ 327/142 |
| 6,281,728 | B1 * | 8/2001 | Sung | ........................... 327/158 |
| 6,680,874 | B1 * | 1/2004 | Harrison | ..................... 365/233 |
| 6,737,897 | B2 * | 5/2004 | Gomm et al. | ............... 327/158 |
| 6,813,197 | B2 | 11/2004 | Park | |
| 6,934,215 | B2 | 8/2005 | Chung et al. | |
| 6,989,700 | B2 | 1/2006 | Kim | |
| 7,061,287 | B2 | 6/2006 | Jeon | |
| 7,282,974 | B2 * | 10/2007 | Lee | ........................... 327/158 |
| 7,282,976 | B2 * | 10/2007 | Park | ........................... 327/172 |
| 7,285,996 | B2 * | 10/2007 | Fiedler | ....................... 327/158 |
| 2004/0066873 | A1 | 4/2004 | Cho et al. | |

FOREIGN PATENT DOCUMENTS

| JP | 2004-129255 | 4/2004 |
| JP | 2005-136949 | 5/2005 |
| JP | 2005-251370 | 9/2005 |
| KR | 10-2003-0016281 | 2/2003 |
| KR | 10-2004-0103035 A | 12/2004 |

OTHER PUBLICATIONS

Korean Office Action, with English Translation, issued in corresponding Korean Patent Application No. KR 10-2006-0049120, dated on Jun. 19, 2007.

* cited by examiner

*Primary Examiner*—Cassandra Cox
(74) *Attorney, Agent, or Firm*—McDermott Will & Emery LLP

(57) ABSTRACT

A delayed locked loop, capable of a duty cycle compensation, resets if a phase difference between outputs from delay blocks in the delay locked loop is over a predetermined amount after a delay locking state is achieved. The delay locked loop includes a duty cycle compensator for receiving first and second clocks and a reset control block for resetting the delay locked loop if a phase difference between the first and second clocks is over a predetermined amount after the delay locked loop achieves a delay locking state.

20 Claims, 8 Drawing Sheets

DELAY LOCKED LOOP

FIELD OF INVENTION

The present invention relates to a delay locked loop for use in a computer system or a semiconductor device such as a memory device; and, more particularly, to a delay locked loop (DLL) having an ability for duty cycle compensation.

This application claims priority to Korean Patent Application No. 2005-0091681 filed Sep. 29, 2005 and Korean Patent Application No. 2006-0049120 filed May 31, 2006.

BACKGROUND

In a high speed synchronous semiconductor memory device such as a double data rate synchronous dynamic random access memory (DDR SDRAM), data is transferred (input from or output to) to other devices in synchronization with an external clock signal. That is, the high speed synchronous semiconductor memory device such as the DDR SDRAM performs an input or output operation in synchronization with not only a rising edge but also a falling edge of the external system clock signal. Typically, in a system or a circuit including a semiconductor memory, a clock signal is used as a reference signal for adjusting operation timing to guarantee stable data access and data transfer without error. For stable data access and data transfer, a delay occurring from the use of plural elements for data transfer should be compensated to exactly set a data output timing at edges of clock signal or on centers of clock signal.

To control the data output timing to be synchronized with the transition timing of the external clock, the synchronous semiconductor memory device includes a clock synchronization circuit. The clock synchronization circuit may include a phase locked loop (PLL) and/or a delay locked loop (DLL). Typically, in case that a frequency of the external clock differs from that of an internal clock in the semiconductor memory device, the PLL is used because the clock synchronization circuit can adjust the frequency of an internal clock in the semiconductor memory device. In case that a frequency of the external clock is the same as that of an internal clock in the semiconductor memory device, the DLL is generally used.

The delay locked loop generates a DLL output clock by compensating a clock skew occurring in a path having a predetermined delay amount estimated from a clock path and data path where data or the clock signal passes through in the semiconductor memory device; then, the DLL output clock is used for synchronizing data input/output with external clock. The DLL has better advantage for noise than the PLL used in a conventional device and, thus, is used broadly in the synchronous memory device including the DDR SDRAM. Recently, a register controlled DLL has been widely used. The register controlled DLL stores a prior delay amount for a delay locking state in a register when power is off, and when power is on, the register controlled DLL loads the stored delay amount for applying to a delay locking operation in order to reduce an initial time for the delay locking state.

As the semiconductor memory device operates faster, an input external clock and an internal clock can be distorted. If either the input external clock or the internal clock is distorted, the delay locked loop can generate faulty DLL clocks and, accordingly, the semiconductor memory device can operate abnormally due to the faulty DLL clocks. Further, if the input external clock and the internal clock are not distorted, the delay locked loop can distort DLL output clocks on operations for controlling a delay amount of the internal clock. In addition, correct duty ratio of the DLL output clocks is a critical factor for stable operations of the semiconductor memory device.

For maximizing a valid data window of outputting data in the semiconductor memory device, the internal clock used therein is symmetrically formed, i.e., it is required that the duty ratio of the internal clock should be 50:50. However, in the semiconductor memory device, the internal clock may not have a symmetrical waveform because an input clock is not symmetrical or the duty ratio is distorted by internal operations. For overcoming a distortion about the duty ratio of internal clock to set the duty ratio to 50:50, duty cycle compensation (DCC operation) is needed.

FIG. 1 is a block diagram of a conventional delay locked loop (DLL) performing duty cycle compensation.

As shown, the conventional delay locked loop (DLL) includes a clock buffer 10, first and second delay blocks 40 and 40', first and second phase comparators 20 and 20', first and second delay replica models 30 and 30', a duty cycle compensation block, and first and second phase splitter. Herein, the duty cycle compensation block includes a DCC mixer 50, a dummy DCC mixer 60, a DCC phase comparator 80, and a mixer controller 70. The DCC mixer 50 is for mixing two clocks output from the first and second delay blocks 40 and 40'. The dummy DCC mixer 60 may be the same as the DCC mixer 50.

The clock buffer 10 receives an external clock signal CLK and an external clock bar signal CLKB to generate first and second internal clocks Clkin1 and Clkin2 and a reference clock Ref_clk.

The first and second delay comparators 20 and 20' recognize a phase difference between input/output clocks of the delay locked loop. In detail, The first and second delay comparators 20 and 20' respectively compare a phase of the reference clock Ref_clk output from the clock buffer 10 with those of first and second feedback clocks fb and fb2 output from the first and second delay replica models 30 and 30' to thereby control the first and second delay blocks 40 and 40' based on the comparison result.

The first and second delay blocks 40 and 40' control delay amount of the first and second internal clocks Clkin1 and Clkin2 according to outputs of the first and second delay comparators 20 and 20' respectively to generate first and second delay adjusted signals Rising_CLK and Falling_CLK.

The first and second delay replica models 30 and 30' delay outputs of the duty cycle compensation block by a predetermined amount estimated from a clock path and data path where data or the clock signal passes through the semiconductor memory device. That is, the first and second delay replica models 30 and 30' respectively include replica delay elements located in clock signal paths: one is from an input pin, i.e., inside of the chip, to the delay block 30, and the other is from the delay block 30 to an output pin.

The DCC mixer 50 is for mixing the first delay adjusted signals Rising_CLK output from the first delay block 40 for controlling a duty ratio to thereby set a 50:50 duty ratio.

Similar to the DCC mixer 50, the dummy DCC mixer 60, including the same elements as the DCC mixer 50, receives the second delay adjusted signals Rising_CLK output from the first delay block 40 to thereby set a 50:50 duty ratio.

The mixer controller 70 is for controlling the DCC mixer 50 and the dummy DCC mixer 60 in response to an output of the DCC phase comparator 80.

The DCC phase comparator 80 compares the first and second delay adjusted signals Rising_CLK output from the first delay block 40 with the second delay adjusted signals Falling_CLK output from the second delay block 40' and determines a weight for the first and second delay adjusted signals Rising_CLK and Falling_CLK. Herein, the term "weight" means a value for increasing a size of an inverter, included DCC mixer 50 or the dummy DCC mixer 60', coupled to one having a phase leading the other between the first and second delay adjusted signals Rising_CLK and Falling_CLK according to a comparison result of the DCC phase comparator 80.

The first and second phase splitters receive outputs of the duty cycle compensation block and outputs DLL clocks, e.g., rclkdll and fclkdll, to external circuits.

Hereinafter, operations of the conventional delay locked loop (DLL) performing duty cycle compensation are described.

Receiving the external clock signal CLK and the external clock bar signal CLKB, the clock buffer 10 generates the first and second internal clocks Clkin1 and Clkin2. The first and second internal clocks Clkin1 and Clkin2 are input to the first and second delay blocks 40 and 40'. Output from the first and second delay blocks 40 and 40', the first and second delay adjusted signals Rising_CLK and Falling_CLK are input to the duty cycle compensation block; duty cycles of the first and second delay adjusted signals Rising_CLK and Falling_CLK are compensated. Thereafter, outputs of the duty cycle compensation block is fed back throughout the first and second delay replica models 30 and 30' to output as the first and second feedback clocks fb and fb2. If rising edges of the first and second feedback clocks fb and fb2 correspond to that of the reference clock Ref_clk, the delay locked loop achieves a delay locking state.

Though the same clock can be input to the first and second delay blocks 40 and 40', i.e., the first and second internal clocks Clkin1 and Clkin2 have the same phase, the second delay block 30' generates an inverse signal of the input signal so that the first and second delay adjusted signals Rising_CLK and Falling_CLK have an opposite phase, i.e., duty ratios of the first and second delay adjusted signals Rising_CLK and Falling_CLK are opposite each other. Referring to FIG. 1, there is an inverter in the second delay block 40' for inverting the duty ratio of the second delay adjusted signal Falling_CLK. For example, if the first delay block 40 includes two inverters at the end, the second delay block 40' includes three inverters at the end.

On an initial operation, the DCC mixer 50 bypasses the first delay adjusted signal Rising_CLK in order to arrange the first feedback clock fb with the reference clock Ref_clk. Likewise, the dummy DCC mixer 60 also bypasses the second delay adjusted signal Fising_CLK so that the second feedback clock fb2 has the same delay as the first feedback fb; the output from the dummy DCC mixer 60 is passed throughout the second delay replica model 30'. Thereafter, If the second feedback fb2 is arranged with the reference clock Ref_clk, the delay locking state is achieved.

FIG. 2 is a schematic circuit diagram depicting a DCC mixer shown in FIG. 1.

As shown, the DCC mixer receives the first and second delay adjusted signals Rising_CLK and Falling_CLK to mix phases thereof in response to a mixing control signal mix, a weight selection signal weight_sel. Further, the DCC mixer is controlled by enable signals clkbuf_enb and DCC_enb for reducing power consumption. Also, power signals VSSDL and VDDL are used for adjusting a size of inverters between an internal node 'a' and the first and second delay adjusted signals Rising_CLK and Falling_CLK.

The DCC mixer is well known by people skilled in the art; thus, detailed description of the structure and operation of the DCC mixer is omitted herein.

FIG. 3 is a timing diagram demonstrating operations of the conventional delay locked loop (DLL) shown in FIG. 1.

As shown, after the delay locked loop achieves the delay locking state in two loops for the first and second internal clocks Clkin1 and Clkin2, the rising edge of the first delay adjusted signals Rising_CLK corresponds to that of the second delay adjusted signal Falling_CLK. However, duty ratios of the first and second delay adjusted signals Rising_CLK and Falling_CLK are opposite each other.

Thereafter, the DCC mixer 50 performs a phase mixing operation to the first and second delay adjusted signals Rising_CLK and Falling_CLK and, as a result, the delay locked loop can obtain a duty compensated clock mix_out having an exact 50:50 duty ratio. Based on the duty compensated clock, the first phase splitter generates the rising and falling DLL clocks rclkdll and fclkdll to external circuits.

As above described, on two loops in the delay locked loop the delay locking operation is independently performed; thus, a delay amount for the first internal clock Clkin1 to pass through one loop is different from the delay amount for second internal clock Clkin2 to pass through the other loop. For example, if a first internal clock Clkin1 having a 50% (50:50) duty ratio is locked without passing any delay element in one loop, the second internal clock Clkin2 should be passed through delay elements having ½ tCK delay time (1 tCK means one period of the external clock) for delay locking, i.e., corresponding to the rising edges of the first and second delay adjusted signals Rising_CLK and Falling_CLK.

It is assumed that a level of a power voltage VDD goes down. Even though the first and second delay adjusted signals Rising_CLK and Falling_CLK passes the same delay elements, a delay amount under a low power voltage is larger than that under a high power voltage. Accordingly, a phase difference between the first and second delay adjusted signals Rising_CLK and Falling_CLK become larger under the low power voltage.

FIG. 4 is a simulated waveform depicting a phase difference between the first and second delay adjusted signals according to decrease of a power voltage, and FIG. 5 is a waveform depicting distortion of the first and second delay adjusted signals according to variation of the power voltage.

Referring to FIGS. 5 and 6, there is a timing difference between rising edges of the first and second delay adjusted signals Rising_CLK and Falling_CLK according to increase or decrease of the power voltage. If the power voltage is varied after the delay locking state, there is a phase difference td between the first and second delay adjusted signals Rising_CLK and Falling_CLK. At this case, since the first and second delay blocks 40 and 40' is operated based on the first and second feedback signals fb and fb2, the phase difference td cannot be removed.

FIG. 6 is a simulated waveform describing distortion of outputs from the DCC mixer 50 in response to the phase difference td between the first and second delay adjusted signals Rising_CLK and Falling_CLK shown in FIG. 1.

Referring to FIG. 6, if the phase difference td between the first and second delay adjusted signals Rising_CLK and Falling_CLK is ½ tCK, the rising and falling DLL clocks rclkdll and fclkdll are not toggled any longer. Accordingly, if the phase difference td between the first and second delay adjusted signals Rising_CLK and Falling_CLK is above a predetermined amount when the power voltage is varied after the delay locking state, the duty cycle compensation block cannot operate appropriately.

SUMMARY OF THE INVENTION

It is an object of the present invention to provide a delayed locked loop capable of duty cycle compensation, and for resetting the delay locked loop if a phase difference between outputs from delay blocks in the delay locked loop exceeds a predetermined amount after a delay locking state is achieved.

In accordance with an aspect of the present invention, there is provided a delay locked loop device, including a delay locked loop including a duty cycle compensator for receiving first and second clocks and a reset control block for resetting the delay locked loop if a phase difference between the first and second clocks is over a predetermined amount after the delay locked loop achieves a delay locking state.

In accordance with another aspect of the present invention, there is provided a semiconductor memory device, including a delay locked loop for delaying an external clock, adjusting a duty cycle ratio of delayed clocks, and generating DLL output clocks to thereby synchronize timing of outputting data responsive to a read command with the external clock and a reset control block for comparing phase of the delayed clocks to reset the delay locked loop.

BRIEF DESCRIPTION OF THE DRAWINGS

The above and other objects and features of the present invention will become better understood with respect to the following description of the specific embodiments given in conjunction with the accompanying drawings, in which.

DETAILED DESCRIPTION OF THE INVENTION

Hereinafter, a delay locked loop for use in a semiconductor memory device in accordance with specific embodiments of the present invention will be described in detail with reference to the accompanying drawings.

Figure 7:
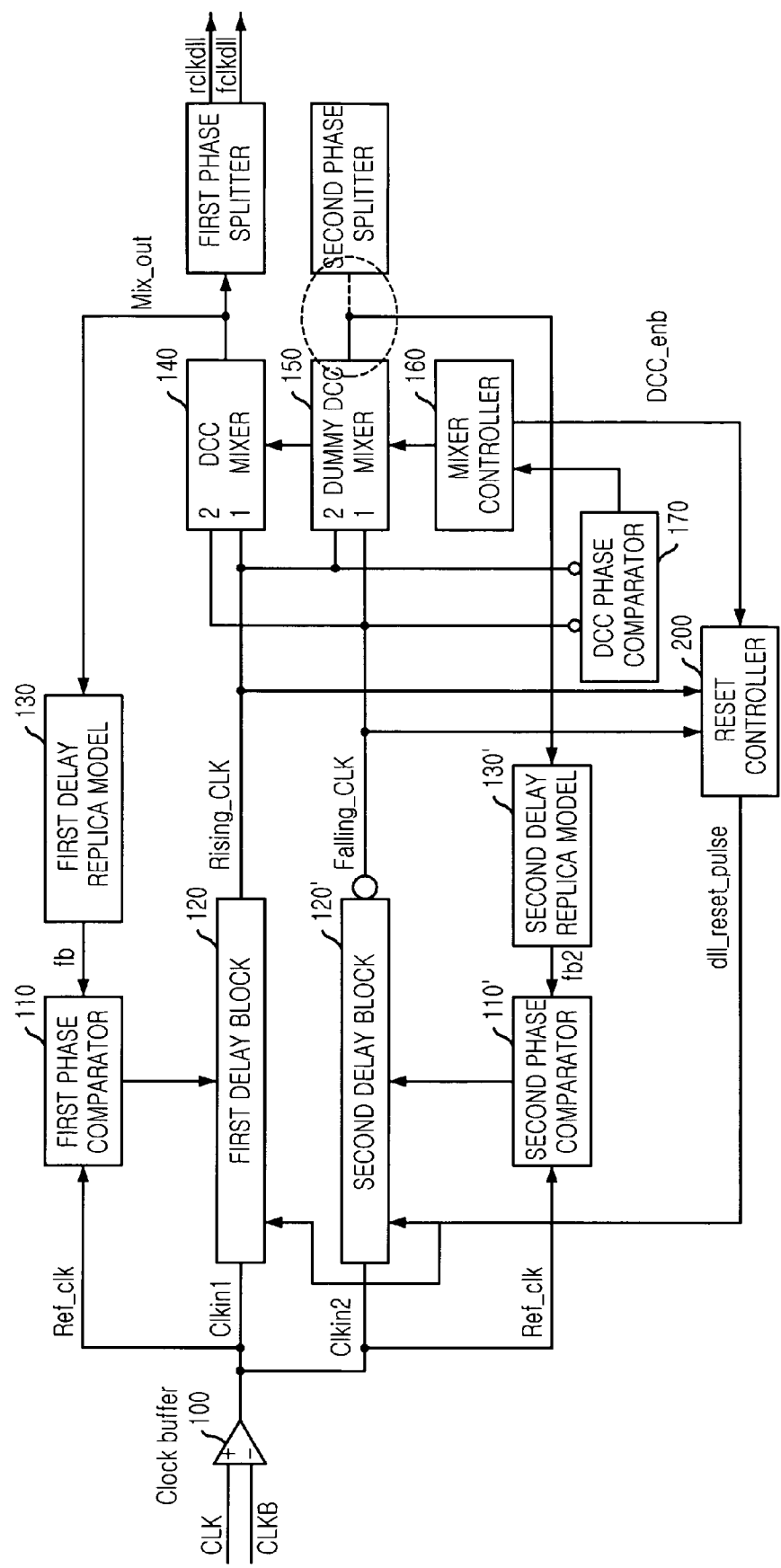
FIG. 7 is a block diagram of a delay locked loop including a reset controller in accordance with an embodiment of the present invention.

FIG. 7 is a block diagram of a delay locked loop including a reset controller 200 in accordance with an embodiment of the present invention.

As shown, the delay locked loop includes a clock buffer 100, first and second delay blocks 120 and 120', first and second phase comparators 110 and 110', first and second delay replica models 130 and 130', a reset controller 200, a duty cycle compensation block, and first and second phase splitter. The duty cycle compensation block includes a DCC mixer 140, a dummy DCC mixer 150, a DCC phase comparator 170, and a mixer controller 160. The DCC mixer 150 is for mixing two clocks output from the first and second delay blocks 120 and 120'.

The reset controller 200 receives first and second delay adjusted signals Rising_CLK and Falling_CLK and resets the first and second delay blocks 120 and 120' in the delay locked loop if a phase difference between the first and second delay adjusted signals Rising_CLK and Falling_CLK exceeds a predetermined amount after the delay locked loop achieves a delay locking state. Herein, the predetermined amount is larger than an operational jitter of the delay locked loop. The term "operational jitter" means a jitter occurring unavoidably on predetermined operations of each logic block for achieving a predetermined intended purpose.

Figure 1:
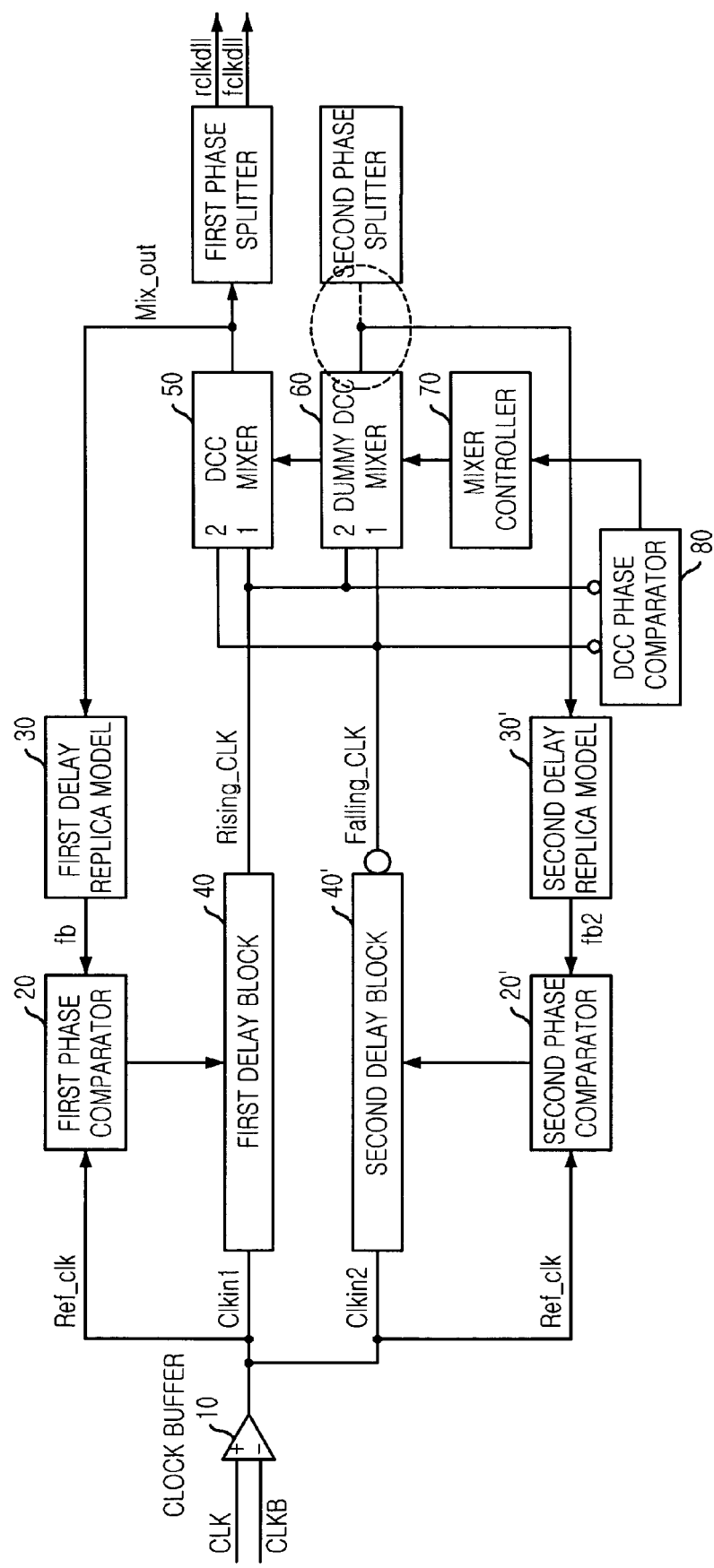
FIG. 1 is a block diagram of a conventional delay locked loop (DLL) performing duty cycle compensation.
Figure 2:
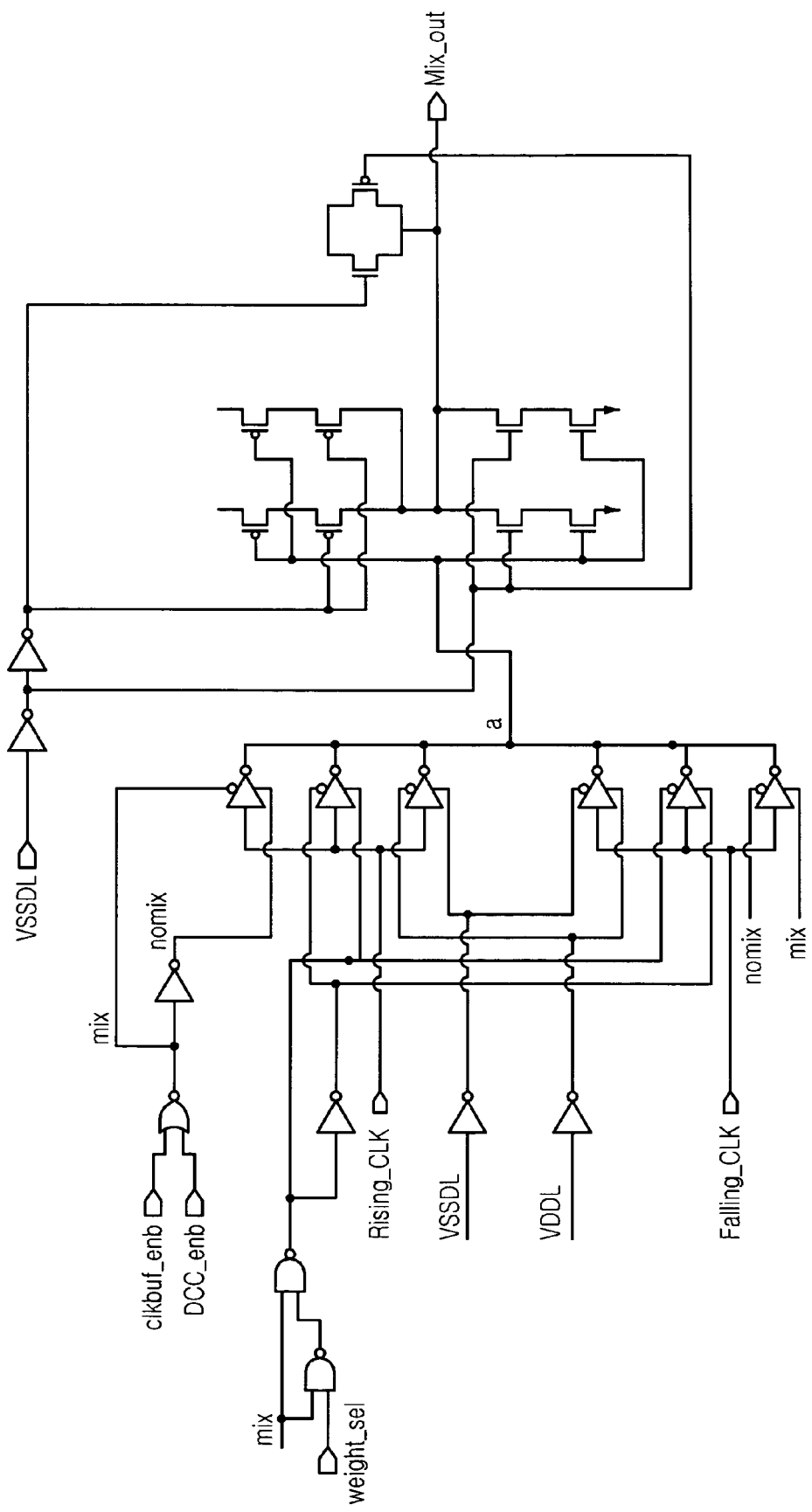
FIG. 2 is a schematic circuit diagram of a DCC mixer shown in FIG. 1.
Figure 3:
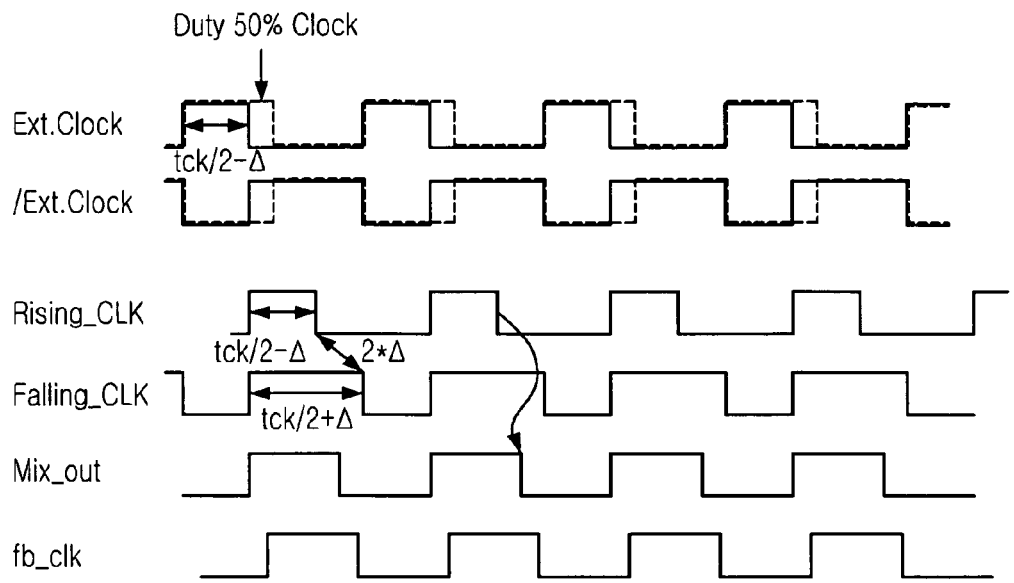
FIG. 3 is a timing diagram demonstrating operations of the conventional delay locked loop (DLL) shown in FIG. 1.
Figure 4:
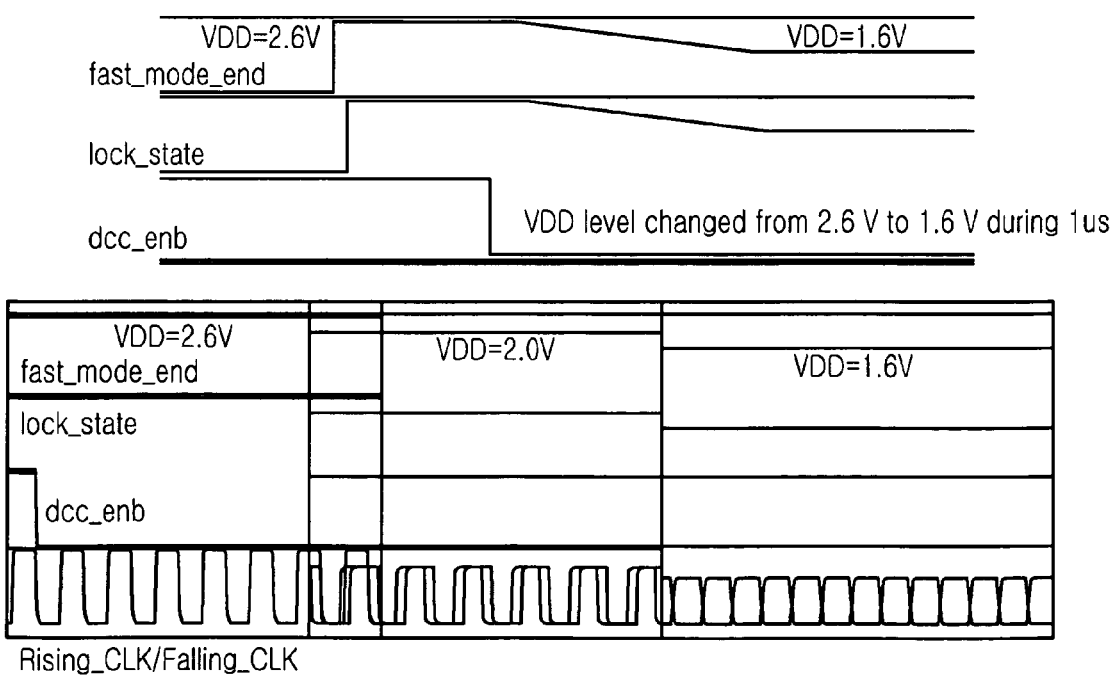
FIG. 4 is a simulated waveform depicting a phase difference between the first and second delay adjusted signals according to decrease of a power voltage.
Figure 5:
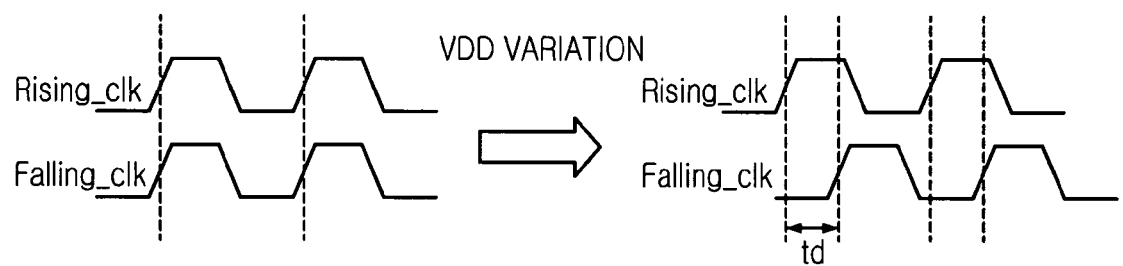
FIG. 5 is a waveform depicting distortion of the first and second delay adjusted signals according to variation of the power voltage.
Figure 6:
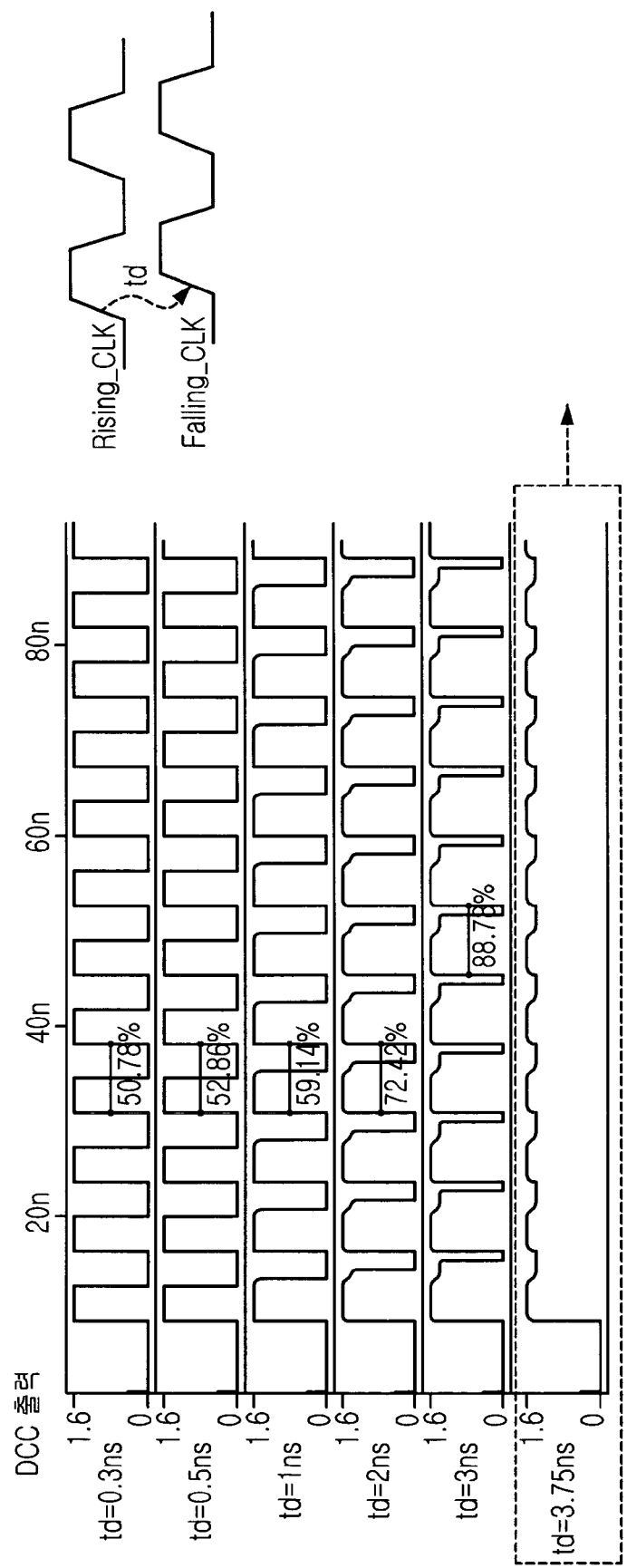
FIG. 6 is a simulated waveform describing distortion of outputs from the DCC mixer in response to the phase difference between the first and second delay adjusted signals shown in FIG. 1.

Except for the reset controller 200, other elements included in the delay locked loop are similar to those of the conventional delay locked loop shown in FIG. 1. The clock buffer 100 buffers external clocks CLK and CLKB to generate first and second internal clocks Clkin1 and Clkin2 and a reference clock Ref_clk. The first delay block 120 is for delaying the first internal clock Clkin1 by a controlled delay amount to generate the first delay adjusted signal Rising_CLK. Similarly, the second delay block 120' receives the second internal clock Clkin2 and delaying the second internal clock Clkin2 by a controlled delay amount to generate the second delay adjusted signal Rising_CLK.

The DCC mixer 140 is for mixing phases of the first and second delay adjusted signals Rising_CLK and Falling_CLK. Likewise, the dummy DCC mixer 150 is for mixing the phases of the first and second delay adjusted signals Rising_CLK and Falling_CLK. An output of the DCC mixer 140 is input to the first delay replica model 130, and an output of the dummy DCC mixer 150 is input to the second delay replica model 130'.

The DCC phase comparator 150 compares the phases of the first and second delay adjusted signals Rising_CLK and Falling_CLK to output a comparison result to the mixer controller 160 for controlling the DCC mixer 140 and the dummy DCC mixer 150. The mixer controller 160 controls the DCC mixer 140 and the dummy DCC mixer 150 based on a comparison result of the DCC phase comparator 150.

The first and second delay replica models 130 and 130' delay outputs of the duty cycle compensation block by a predetermined amount estimated from a clock path and data path where data or the clock signal passes on in the semiconductor memory device.

The first delay replica model 130 feeds back an output of the DCC mixer 140 to generate a first feedback clock fb. The first phase comparator 110 compares a phase of the first feedback clock fb with that of the reference clock Ref_clk to control the first delay block 120.

Likewise, the second delay replica model 130' feeds back an output of the dummy DCC mixer 150 to generate a second feedback clock fb2, and the second phase comparator 110' compares a phase of the second feedback clock fb2 with that of the reference clock Ref_clk to control the second delay block 120'.

Figure 8:
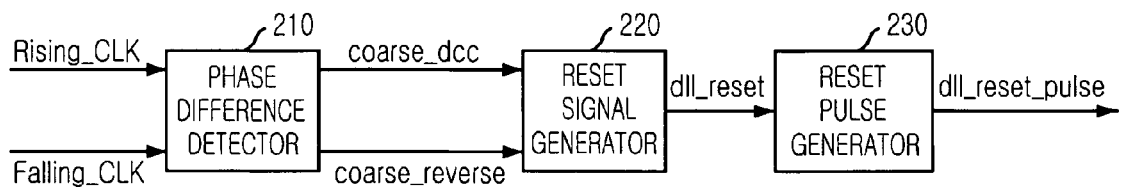
FIG. 8 is a block diagram of the reset controller shown in FIG. 7.

FIG. 8 is a block diagram of the reset controller 200 shown in FIG. 7.

As shown, the reset controller 200 includes a phase difference detector 210, a reset signal generating block 220 and a reset pulse generating block 230.

The phase difference detector 210 detects the phase difference between the first and second delay adjusted signals Rising_CLK and Falling_CLK to generate first and second phase detect signals coarse_dcc and coarse_reverse. The reset signal generator 220 generates a reset signal dll_reset in response to an enable signal DCC_enb for the duty cycle compensation block and outputs from the phase difference detector 210, i.e., the first and second phase detect signals coarse_dcc and coarse_reverse. The reset pulse generator 230 generates a reset pulse signal dll_reset_pulse based on the reset signal dll_reset.

Figure 9:
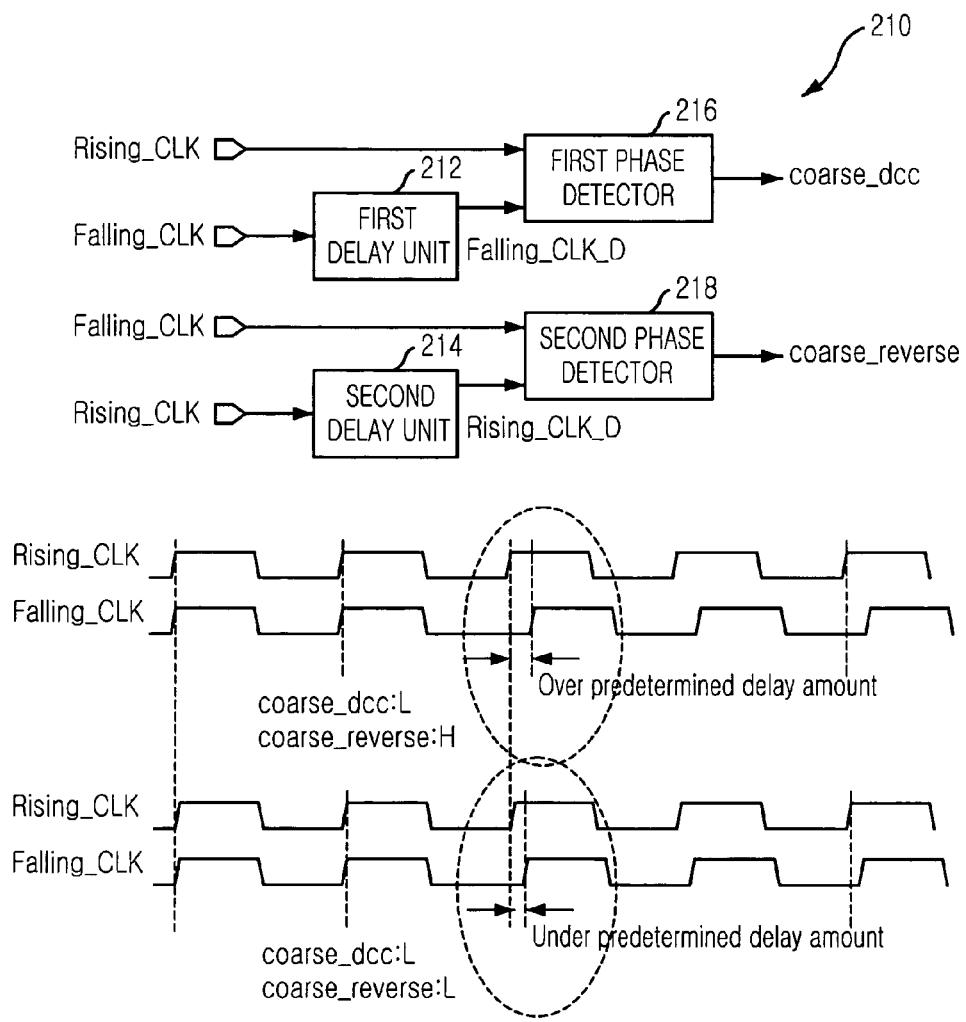
FIG. 9 is a block diagram of a phase difference detector shown in FIG. 8.

FIG. 9 is a block diagram of the phase difference detector 210 shown in FIG. 8.

As shown the phase difference detector 210 includes a first delay block 212 for delaying the second delay adjusted signal Falling_CLK by the predetermined amount which is larger than the operational jitter of the delay locked loop, a second delay block 214 for delaying the first delay adjusted signal Ralling_CLK by the predetermined amount, a first phase detector 216 for generating a first phase detect signal coarse_dcc in response to the first delay adjusted signal Ralling_CLK and an output of the first delay block 212, i.e., Falling_CLK_D, and a second phase detector 218 for generating a second phase detect signal coarse_reverse in response to the second delay adjusted signal Falling_CLK and an output of the second delay block 214, i.e., Ralling_CLK_D.

As above described, the first and second delay blocks 212 and 214 respectively have predetermined delay amounts which are larger than an intrinsic jitter, i.e., the operational jitter of the delay locked loopfor the reasong that the first and second delay adjusted signals Ralling_CLK and Falling_CLK can be misaligned by the intrinsic jitter.

The first phase detector 216 is a circuit for sampling a state of the output of the first delay block 212, i.e., Falling_CLK_D, formed by delaying the second delay adjusted signal Falling_CLK by a predetermined amount, at a timing of a rising edge of the first delay adjusted signal Ralling_CLK. Similar to the first phase detector 216, the second phase detector 218 is a circuit for sampling a state of the output of the second delay block 212, i.e., Ralling_CLK_D, formed by delaying the first delay adjusted signal Ralling_CLK by a predetermined amount, at a timing of a rising edge of the second delay adjusted signal Falling_CLK.

Operation of the phase difference detector 210 is described as follows.

If the first delay adjusted signal Ralling_CLK leads the second delay adjusted signal Falling_CLK, the first phase detector 216 generates the first phase detect signal coarse_dcc having a logic low level. At this time, at a rising edge of the second delay adjusted signal Falling_CLK, the first delay adjusted signal Rising_CLK is sampled as a logic high level. The second phase detector 218 delays the first delay adjusted signal Rising_CLK by a predetermined amount. If the output of the first delay block 212, i.e., Falling_CLK_D, remains as a logic high level, the phase difference between the first and second delay adjusted signals Ralling_CLK and Falling_CLK is greater than a predetermined amount. Accordingly, the first phase detector 216 generates the first phase detect signal coarse_dcc having a logic low level.

Otherwise, if a phase of the second delay adjusted signal Falling_CLK leads that of the first delay adjusted signal Ralling_CLK, the second phase detector 218 generates the second phase detect signal coarse_reverse having a logic low level. At this time, at a rising edge of the first delay adjusted signal Ralling_CLK, the second delay adjusted signal Fising_CLK is sampled as a logic high level. The first phase detector 212 delays the second delay adjusted signal Fising_CLK by a predetermined amount. If the output of the second delay block 214, i.e., Ralling_CLK_D, remains as a logic high level, the phase difference between the first and second delay adjusted signals Ralling_CLK and Falling_CLK is greater than a predetermined amount. Accordingly, the second phase detector 218 generates the second phase detect signal coarse_reverse having a logic low level.

That is, if one of the first and second phase detect signals coarse_dcc and coarse_reverse output from the first and second phase detector 216 and 218 transits from a logic high level to a logic low level, the delay locked loop can be reset.

Figure 10:
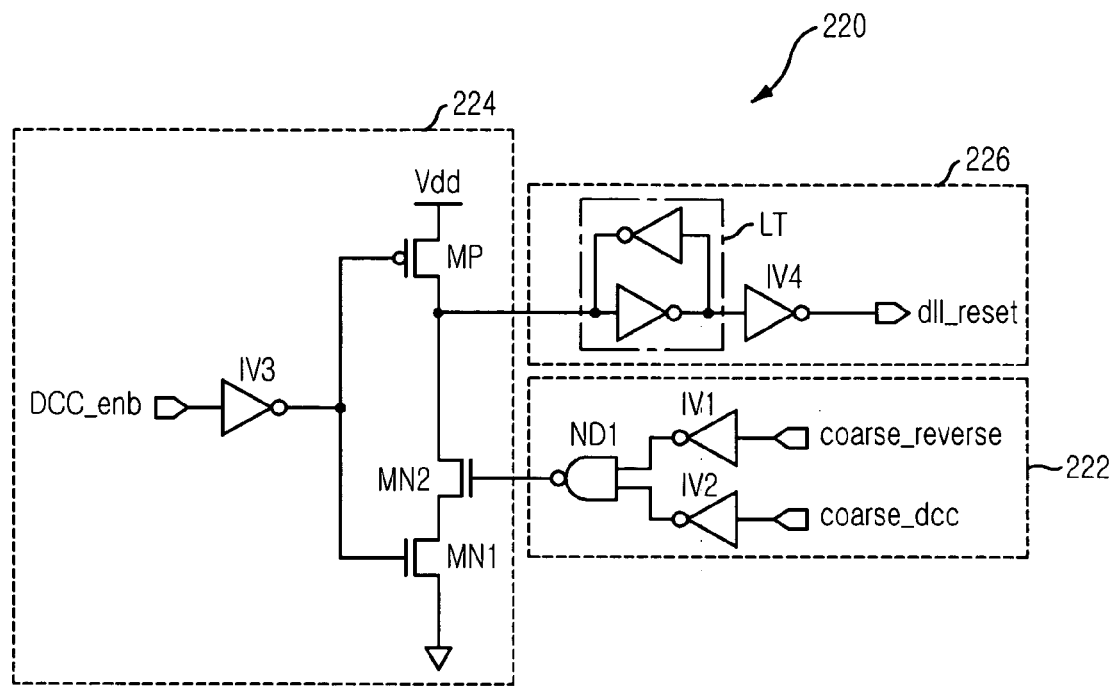
FIG. 10 is a schematic circuit diagram of a reset signal generator shown in FIG. 8.

FIG. 10 is a schematic circuit diagram describing a reset signal generator 220 shown in FIG. 8.

As shown, the reset signal generator 220 includes a detection input block 222 for performing a predetermined logic operation to outputs of the phase difference detector 210, i.e., the first and second phase detect signals coarse_dcc and coarse_reverse, a switching block 224 for transferring the enable signal DCC_enb for the duty cycle compensation block in response to an output of the detection input block 222, and a latch block 226 for latching an output of the switching block 224 to generate the reset signal dll_reset.

The detection input block 222 includes a first inverter IV1 for inverting an output of the first phase detector 216, i.e., the first phase detect signal coarse_dcc, a second inverter IV2 for inverting an output of the second phase detector 218, i.e., the second phase detect signal coarse_reverse, and a logic NAND gate ND1 for performing a logic NAND operation to outputs of the first and second inverters IV1 and IV2.

The switching block 224 includes a third inverter IV3 for inverting the enable signal DCC_enb for the duty cycle compensating block, a PMOS transistor MP for supplying a power voltage Vdd in response to an output of the third inverter IV3, a first NMOS transistor MN1 for supplying a ground voltage in response to the output of the third inverter IV3, and a second NMOS transistor MN2 for transferring an output of the first NMOS transistor MN1 in response to the output of the detection input block 222. The predetermined voltage supplied between the PMOS transistor MP and the second NMOS transistor MN2 is output as the output of the switching block 224 into the latch block 226.

The latching block 226 includes an inverter latch LT for latching the output of the switching block 224 and a fourth inverter IV4 for inverting an output of the inverter latch LT to generate the reset signal dll_reset.

Operation of the reset signal generator 220 as above described is described as follows.

If the delay locking state is achieved, the enable signal for the duty cycle compensation block transits from a logic high level to a logic low level. However, if one of the first and second phase detect signals coarse_dcc and coarse_reverse output from the first and second phase detector 216 and 218 transits from a logic high level to a logic low level, an output of the detection input block 222 becomes a logic high level because the first and second phase detect signals coarse_dcc and coarse_reverse are passed through the first and second inverters IV1 and IV2 respectively and the inverse signals of the first and second phase detect signals coarse_dcc and coarse_reverse are combined by a logic NAND operation of the logic NAND gate ND1. As a result, the reset signal dll_reset transits from a logic high level to a logic low level.

Figure 11:
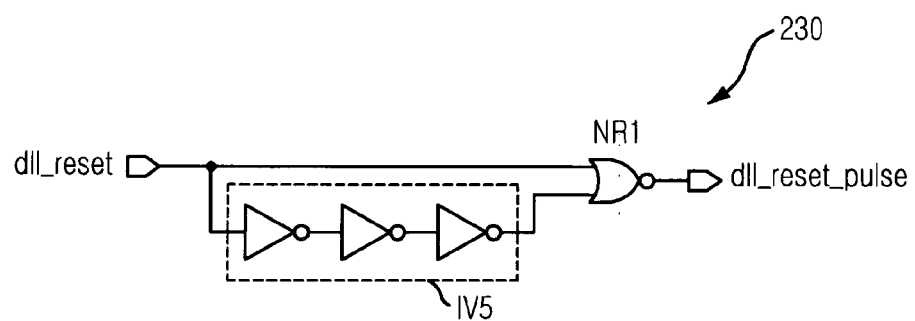
FIG. 11 is a schematic circuit diagram of a reset pulse generator shown in FIG. 8.

FIG. 11 is a schematic circuit diagram describing the reset generator 230 shown in FIG. 8.

As shown, the reset pulse generator 230 includes a first inverting group IV5 containing an odd number of serially connected inverters and a logic NOR gate NR1 for receiving the reset signal dll_reset and an output of the first inverting group IV5 to form the reset pulse signal dll_reset_pulse.

As above described, referring to FIG. 7 to 11, the delay locked loop can be reset by the reset controller 200 when there is a phase difference between the first and second delay adjusted signals Rising_CLK and Falling_CLK after a delay locking state and achieve the delay locking state within a number of cycles again.

After achieving a delay locking state, the present invention capable of duty cycle compensation resets the delay locked loop to performing operations for delay locking state again if a phase difference between outputs from delay blocks in the delay locked loop is greater than a predetermined amount.

The present application contains subject matter related to the Korean patent applications Nos. KR 10-2005-0091681 and KR 10-2006-0049120, filed in the Korean Patent Office on Sep. 29, 2005 and on May 31, 2006 respectively, the entire contents of which being incorporated herein by references.

While the present invention has been described with respect to certain specific embodiments, it will be apparent to those skilled in the art that various changes and modifications may be made without departing from the spirit and scope of the invention as defined in the following claims.

What is claimed is:

1. A delay locked loop device, comprising:
   a delay locked loop including a duty cycle compensator for receiving first and second clocks; and
   a reset control means for resetting the delay locked loop if a phase difference between the first and second clocks is greater than a predetermined amount after the delay locked loop achieves a delay locking state.

2. The delay locked loop device as recited in claim 1, wherein the reset control means includes:
   a phase difference detecting block for detecting the phase difference between the first and second clocks;
   a reset signal generating block for generating a reset signal in response to an enable signal for the duty cycle compensator and an output from the phase difference detecting block; and
   a reset pulse generating block for generating a reset pulse signal based on the reset signal.

3. The delay locked loop device as recited in claim 2, wherein the predetermined amount is larger than an operational jitter of the delay locked loop.

4. The delay locked loop device as recited in claim 2, wherein the phase difference detecting block includes:
   a first delay block for delaying the second clock by the predetermined amount which is larger than an operational jitter of the delay locked loop;
   a second delay block for delaying the first clock by the predetermined amount;
   a first phase detector for generating a first phase detect signal in response to the first clock and an output of the first delay block; and
   a second phase detector for generating a second phase detect signal in response to the second clock and an output of the second delay block.

5. The delay locked loop device as recited in claim 4, wherein the reset signal generating block includes:
   a detection input block for performing a predetermined logic operation to outputs of the phase difference detecting block;
   a switching block for transferring the enable signal for the duty cycle compensator in response to an output of the detection input block; and
   a latch block for latching an output of the switching block to generate the reset signal.

6. The delay locked loop device as recited in claim 5, wherein the detection input block includes:
   a first inverter for inverting an output of the first phase detector;
   a second inverter for inverting an output of the second phase detector; and
   a logic NAND gate for performing a logic NAND operation to outputs of the first and second inverters.

7. The delay locked loop device as recited in claim 5, wherein the switching block includes:
   a third inverter for inverting the enable signal for the duty cycle compensator;
   a PMOS transistor for supplying a power voltage in response to an output of the third inverter;
   a first NMOS transistor for supplying a ground voltage in response to the output of the third inverter; and
   a second NMOS transistor for transferring an output of the first NMOS transistor in response to the output of the detection input block,
   wherein a predetermined voltage supplied between the PMOS transistor and the second NMOS transistor is output as the output of the switching block.

8. The delay locked loop device as recited in claim 5, wherein the latching block includes:
   an inverter latch for latching the output of the switching block; and
   a fourth inverter for inverting an output of the inverter latch to generate the reset signal.

9. The delay locked loop device as recited in claim 4, wherein the reset pulse generating block includes:
   a first inverting group containing an odd number of serially connected inverters; and
   a logic NOR gate for receiving the reset signal and an output of the first inverting group to form the reset pulse signal.

10. The delay locked loop device as recited in claim 1, wherein the delay locked loop includes:
   a first delay block for generate the first clock; and
   a second delay block for generate the second clock,
   wherein the reset control means controls the first and second delay blocks to thereby reset the delay locked loop.

11. The delay locked loop device as recited in claim 2, wherein the delay locked loop includes:
   a first delay block for generate the first clock; and
   a second delay block for generate the second clock,
   wherein the reset pulse signal resets the first and second delay blocks.

12. The delay locked loop device as recited in claim 1, wherein the delay locked loop includes:
a clock buffer for buffering an external clock to generate first and second internal clocks and a reference clock;
a first delay block for delaying the first internal clock by a controlled delay amount to generate the first clock;
a second delay block for delaying the second internal clock by a controlled delay amount to generate the second clock;
a DCC mixer for mixing phases of the first and second clocks;
a dummy DCC mixer for mixing the phases of the first and second clocks;
a DCC phase comparator for comparing the phases of the first and second clocks;
a mixer controller for controlling the DCC mixer and the dummy DCC mixer based on a comparison result of the DCC phase comparator;
a first delay replica model for feeding back an output of the DCC mixer to generate a first feedback clock;
a first phase comparator for comparing a phase of the first feedback clock with that of the reference clock to control the first delay block;
a second delay replica model for feeding back an output of the dummy DCC mixer to generate a second feedback clock; and
a second phase comparator for comparing a phase of the second feedback clock with that of the reference clock to control the second delay block.

13. A semiconductor memory device, comprising:
a delay locked loop for delaying an external clock, adjusting a duty cycle ratio of delayed clocks, and generating DLL output clocks to thereby synchronize a timing of outputting data responsive to a read command with the external clock; and
a reset control means for comparing phase of the delayed clocks to reset the delay locked loop after a delay locking state.

14. The semiconductor memory device as recited in claim 13, wherein the reset control means includes:
a phase difference detecting block for detecting a phase difference between the delayed clocks;
a reset signal generating block for generating a reset signal in response to an enable signal for duty cycle compensating block and an output from the phase difference detecting block; and
a reset pulse generating block for generating a reset pulse signal based on the reset signal.

15. The semiconductor memory device as recited in claim 14, wherein the predetermined amount is larger than an operational jitter of the delay locked loop.

16. The semiconductor memory device as recited in claim 14, wherein the phase difference detecting block includes:
a first delay block for delaying the second clock by the predetermined amount which is larger than an operational jitter of the delay locked loop;
a second delay block for delaying the first clock by the predetermined amount;

a first phase detector for generating a first phase detect signal in response to the first clock and an output of the first delay block; and
a second phase detector for generating a second phase detect signal in response to the second clock and an output of the second delay block.

17. The semiconductor memory device as recited in claim 14, wherein the reset signal generating block includes:
a detection input block for performing a predetermined logic operation to outputs of the phase difference detecting block;
a switching block for transferring the enable signal for the duty cycle compensator in response to an output of the detection input block; and
a latch block for latching an output of the switching block to generate the reset signal.

18. The semiconductor memory device as recited in claim 13, wherein the delay locked loop includes:
a delay locking block for controlling a delay amount of the external clock to generate the delayed clocks; and
a duty cycle compensating block for adjusting a duty cycle ratio of the delayed clocks.

19. The delay locked loop device as recited in claim 18, wherein duty cycle compensating block includes:
a DCC mixer for mixing phases of the first and second clocks;
a dummy DCC mixer for mixing the phases of the first and second clocks;
a DCC phase comparator for comparing the phases of the first and second clocks; and
a mixer controller for controlling the DCC mixer and the dummy DCC mixer based on a comparison result of the DCC phase comparator.

20. The delay locked loop device as recited in claim 18, wherein the delay locking block includes:
a clock buffer for buffering an external clock to generate first and second internal clocks and a reference clock;
a first delay block for delaying the first internal clock by a controlled delay amount to generate the first clock;
a second delay block for delaying the second internal clock by a controlled delay amount to generate the second clock;
a first delay replica model for feeding back an output of the duty cycle compensating block to generate a first feedback clock;
a first phase comparator for comparing a phase of the first feedback clock with that of the reference clock to control the first delay block;
a second delay replica model for feeding back the output of the duty cycle compensating block to generate a second feedback clock; and
a second phase comparator for comparing a phase of the second feedback clock with that of the reference clock to control the second delay block.

* * * * *